United States Patent
Greenwald et al.

(10) Patent No.: US 6,635,559 B2
(45) Date of Patent: Oct. 21, 2003

(54) FORMATION OF INSULATING ALUMINUM OXIDE IN SEMICONDUCTOR SUBSTRATES

(75) Inventors: Anton C. Greenwald, North Andover, MA (US); Nader Montazernezam Kalkhoran, Tewksbury, MA (US)

(73) Assignee: Spire Corporation, Bedford, MA (US)

( * ) Notice: Subject to any disclaimer, the term of this patent is extended or adjusted under 35 U.S.C. 154(b) by 0 days.

(21) Appl. No.: 09/949,030

(22) Filed: Sep. 6, 2001

(65) Prior Publication Data

US 2003/0042501 A1 Mar. 6, 2003

(51) Int. Cl.$^7$ ...................... H01L 21/28; H01L 21/3205
(52) U.S. Cl. ........................................ 438/604; 438/514
(58) Field of Search .................. 438/506, 502, 438/513, 514, 603, 604, 584, 606, 663, 712, 722, 800, 930, 933, 681

(56) References Cited

U.S. PATENT DOCUMENTS

| | | | |
|---|---|---|---|
| 3,936,322 A | | 2/1976 | Blum et al. |
| 4,469,528 A | | 9/1984 | Berth et al. |
| 4,489,480 A | | 12/1984 | Martin et al. |
| 5,209,987 A | * | 5/1993 | Penneck ...................... 428/610 |
| 5,227,045 A | * | 7/1993 | Townsennd .................. 205/230 |
| 5,328,854 A | | 7/1994 | Vakhshoori et al. |
| 5,352,627 A | | 10/1994 | Cooper |
| 5,436,499 A | * | 7/1995 | Namavar et al. ............ 257/617 |
| 6,124,427 A | * | 9/2000 | Atwood ........................ 528/485 |

OTHER PUBLICATIONS

Koteless, "Progress in Monolithic Photonic Integration Using Quantum Well Shape Modification Enhanced by Ion Implantation", Mat. Rea. Cop. Sump. Proc. vol. 607, pp. 129–140.

H.H. Andersen & S.T. Picraux, "Nuclear Instruments & Methods in Physics Research", Beam Interactions with Materials and Atoms vols. B59/60, Part II, 1991, pp. 981–984.

IEEE Transactions on Electron Devices, vol. 47, No. 9, Sep., 2000, pp. 1769–1772.

Paraskevopoulos et al., IEEE "On–Wafer" Surface Implanted High Power, Picosecond Pulse InGaAsP/InP Laser Diodes, 2000, pp. 278–281.

Akano, et al., "Electrical Isolation of Pin Photodiode Devices by Oxygen Ion Bombardment" Can. J. Phsy. (Suppl.) 74: 1996, pp. S59–S63.

LEOS 1993 Conference Proceedings, IEEE Lasers and Electro–Optics Soceity 1993 Annual Meeting, Nov. 15–18, 1993, pp. 448 and 449.

* cited by examiner

*Primary Examiner*—David Nhu
(74) *Attorney, Agent, or Firm*—Thomas J. Engellenner; Reza Mollaaghababa; Nutter McClennen & Fish LLP

(57) ABSTRACT

The present invention provides methods and apparatus for creating insulating layers in Group III–V compound semiconductor structures having aluminum oxide with a substantially stoichiometric compositions. Such insulating layers find applications in a variety of semiconductor devices. For example, in one aspect, the invention provides vertical insulating layers separating two devices, such as photodiodes, formed on a semiconductor substrate from one another. In another aspect, the invention can provide such insulating layers as buried horizontal insulating layers of semiconductor devices.

12 Claims, 8 Drawing Sheets

FORMATION OF INSULATING ALUMINUM OXIDE IN SEMICONDUCTOR SUBSTRATES

BACKGROUND OF THE INVENTION

The present invention relates generally to semiconductor structures, and more particularly, to semiconductor structures having insulating layers or regions that contain aluminum oxide and to methods for producing such insulating structures.

Insulating materials are employed in various semiconductor structures to provide, for example, isolation between devices formed on a semiconductor substrate and/or to increase the switching speed of such devices. For example, silicon oxide layers are utilized as insulating layers in silicon semiconductor manufacturing. Silicon oxide layers, e.g., $SiO_2$, can be readily produced on semiconductor substrates by utilizing a number of techniques, such as thermal oxidation.

Group III-V semiconductors, such as (AlGa)As, however, do not form adherent, oxide layers as readily as does silicon. The inability to form such native oxide layers inhibits formation of insulating layers that would otherwise provide a simple mechanism for isolation of devices formed on such semiconductors. This, in turn, limits the types of device structures and integrated circuits that are available in Group III-V compound semiconductors.

Thus, a need exists for new and better methods for forming insulating structures in Group III-V semiconductor substrates.

SUMMARY OF THE INVENTION

The present invention provides insulating structures of aluminum oxide with substantially stoichiometric composition in a variety of semiconductor circuits. In one aspect, a semiconductor structure of the invention includes a semiconductor substrate having a device formed thereon. An insulating region having aluminum oxide with a substantially stoichiometric composition isolates the device, at least in part, from the remainder of the substrate. The electrical resistance of the insulating region is preferably greater than about 1000 ohm-cm in order to provide effective isolation of the device from selected portions of the substrate.

The term 'substantially stoichiometric composition', as used herein to describe aluminum oxide produced according to the invention, indicates that the ratio of the oxygen atoms relative to the aluminum atoms is approximately 3/2. In other words, the aluminum oxide can be described by a chemical formula, $Al_xO_y$, where x can range from about 0.5 y to about 1.0 y. Preferably, if x is 2, then y is substantially equal to 3.

The semiconductor substrate can include a Group III-V compound having at least one Group III element, and at least one Group V element. The Group III element can be selected to be, for example, Aluminum (Al), Gallium (Ga), or Indium (In); and the Group V element can be selected to be, for example, Nitrogen (N), Phosphorus (P), Arsenic (As), and Antimony (Sb).

The insulating region formed in accord with the teachings of the invention can be a vertical layer providing electrical isolation in a lateral direction, e.g., in a direction parallel to the substrate surface. Alternatively, the insulating region can be a buried horizontal layer having aluminum oxide with a substantially stoichiometric composition. In other applications, the insulating region can be a peripheral layer surrounding an aperture of a semiconductor device, e.g., a vertical cavity surface emitting laser (VECSL).

In a related aspect, the insulating structure can form a continuous aluminum oxide layer, e.g., a film of aluminum oxide. Alternatively, the insulating structure can include a plurality of aluminum oxide precipitates having a concentration that is preferably at least 1% so as to provide sufficient electrical isolation between different portions of the substrate.

In accord with one aspect of the invention, a vertical insulating layer containing aluminum oxide with a substantially stoichiometric composition separates two neighboring devices, formed on the same semiconductor substrate, along a direction parallel to the substrate surface. The high electrical resistance of the insulating layer (e.g., greater than about 1000 ohm-cm) ensures an effective isolation of the neighboring devices in a lateral direction from one another.

In yet another aspect, the invention provides a semiconductor structure having a semiconductor substrate layer, and a waveguide layer formed on the semiconductor substrate. The waveguide layer can have a central portion formed of GaAs that provides a transmission conduit for electromagnetic radiation having a frequency in a selected range. A peripheral portion containing aluminum oxide having a substantially stoichiometric composition surrounds the central portion. The peripheral portion can have an index of refraction, within a frequency range of interest, that differs from the index of refraction of the central portion, e.g., it is lower than the index of refraction of the central portion.

In a related aspect, the invention provides methods for manufacturing semiconductor devices such as those described above. For example, in one embodiment of a method of the invention, an electrically insulating region is formed in a semiconductor substrate by implanting a selected dose of aluminum ions into a portion of the substrate followed by implanting a selected dose of oxygen ions in that portion, or vice versa. The doses of the implanted oxygen and aluminum ions are chosen such that there are substantially three oxygen ions for every two aluminum ions in the implanted region. Subsequently, the substrate is annealed to cause bonding of the aluminum and oxygen ions to produce aluminum oxide with a substantially stoichiometric composition.

The oxygen and aluminum ions can be implanted in the substrate by exposing the substrate to beams of oxygen and aluminum ions having energies in a range of about 0.5 keV to about 2000 keV, and having ion densities in a range of about $5 \times 10^{15}$ ions/cm$^2$ to about $1 \times 10^{18}$ ions/cm$^2$. More preferably, the energy of the ion beams is approximately 50 to 500 keV.

A mask can be placed on the substrate to allow exposure of a selected portion(s) thereof to the ion beam while protecting the remainder of the substrate from the beams. Such a mask can be formed of a variety of different materials, e.g., $SiO_2$ or $Si_3N_4$, and be patterned physically or lithographically.

The annealing process can be performed in different ambient atmospheres and in a temperature range of about 500° C. to about 1000° C. For example, when the semiconductor substrate is GaAs, the annealing atmosphere can be selected to be an arsine atmosphere. Moreover, the annealing time can be in a range of about 10 seconds to about 48 hours.

If aluminum is one of the atomic constituents of a substrate and is present in sufficient concentration to allow the formation of a continuous aluminum oxide layer or highly concentrated oxide precipitates, the invention can be practiced without implanting aluminum ions by simply implanting sufficient number of oxygen ions into the substrate to form aluminum oxide with a substantially stoichiometric composition.

The insulating structures of the invention can be formed by multiple implantations of aluminum and oxygen ions. For example, vertical insulating layers can be formed by multiple implants of aluminum and oxygen into a vertical portion of the substrate, extending from the surface of the substrate to a selected depth thereof. This can be achieved, for example, by exposing the substrate to ion beams having different energies and ion densities to ensure a substantially uniform distribution of aluminum and oxygen ions in the vertical portion. The energies and the densities of the ion beams can be in a range of about 0.5–2000 keV and $1 \times 10^{15}$–$10^{18}$ ions/cm$^2$, respectively, and are selected such that the ratio of oxygen to aluminum concentration is substantially 3/2. A subsequent annealing process can cause the implanted oxygen and aluminum ions to bond and form aluminum oxide.

The implantation of oxygen ions followed by an annealing step can be sufficient for producing aluminum oxide within a surface region of a substrate if the substrate contains aluminum as one of its constituent atoms.

Another aspect of the invention provides a method for producing an insulating layer surrounding an internal aperture in a vertical cavity surface emitting laser (VCSEL) formed in a semiconductor structure having an active lasing layer and at least one AlGaAs layer above the lasing layer. The method calls for placing a mask on the top surface of the semiconductor structure, which is sized and shaped to produce the internal aperture, followed by implanting a selected dose of oxygen ions in portions of the AlGaAs unobstructed by the mask. A subsequent high temperature annealing step forms aluminum oxide. The oxygen dose is chosen such that the aluminum oxide formed has a substantially stoichiometric composition.

Illustrative embodiments of the invention are described below with reference to the following figures.

DETAILED DESCRIPTION

Figure 1:
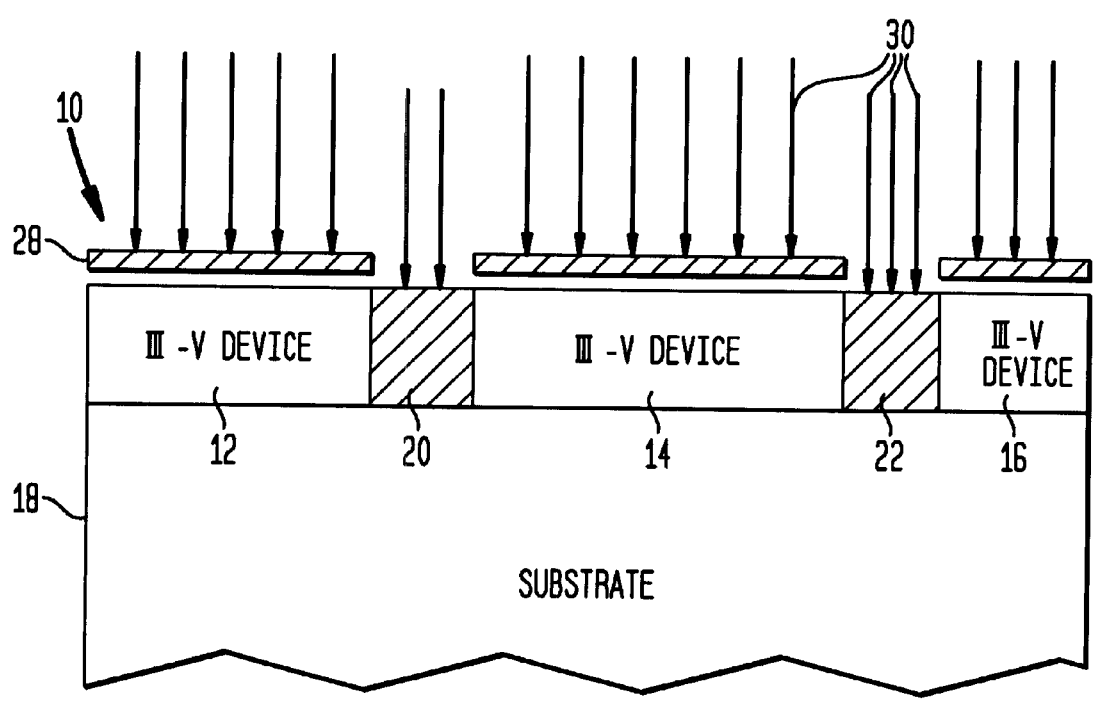
FIG. 1 schematically illustrates an exemplary semiconductor circuit according to the invention having three devices formed in a semiconductor substrate, where each device is separated from a neighboring device by an insulating layer containing aluminum oxide with a substantially stoichiometric composition.

FIG. 1 schematically illustrates an exemplary semiconductor circuit 10 according to the invention which includes three devices 12, 14, and 16 formed in a Group III-V semiconductor substrate 18. A vertical insulating layer 20 separates and electrically isolates the device 12 from the device 14. Another vertical insulating layer 22 electrically isolates the device 14 from the device 16. Each vertical insulating layer 20 and 22 contains aluminum oxide having a substantially stoichiometric composition. That is, the aluminum oxide present in the insulating layers 20 and 22 has a chemical formula Al$_x$O$_y$, where x is substantially equal to 2 and y is substantially equal to 3. The substantially stoichiometric composition of the aluminum oxide within the layers 20 and 22 allows each layer to have an electrical resistance greater than about 1000 ohm-cm. This high electrical resistance in turn enhances the electrical isolation of each device from a neighboring device in a lateral direction, e.g., in a direction parallel to the device surface.

The aluminum oxide present in the insulating layers 20 and 22 can be in the form of a plurality of precipitates, in each of which the composition of the aluminum oxide is substantially stoichiometric. In some embodiments of the invention, the molar concentration of such aluminum oxide precipitates is at least about 1% in order to provide sufficient electrical isolation between neighboring devices.

Alternatively, in each insulating layer 20/22, the aluminum oxide can form a continuous columnar layer extending from the top surface of the semi-conductor to a selected depth thereof.

The illustrative substrate 18 includes a Group III-V compound. The Group III elements can include, e.g., Al, Ga, and In, and the Group V elements can include, e.g., N, P, As, and Sb. Some exemplary substrates suitable for practice of the invention include, but are not limited to, GaAs, AlGaAs, InP, InGaAs, GaN, AlGaN, InGaN, or GaSb. Further, the exemplary devices 12, 14, and 16 can be a variety of different semiconductor devices. Such devices can include, but are not limited to, photodiodes, vertical cavity surface emitting diodes (VECSL), transistors, high electron mobility transistors (HEMT), light emitting diodes (LED), and metal insulator field-effect-transistors (MISFET). In addition, each device can be the same or different from a neighboring device.

Figure 2:
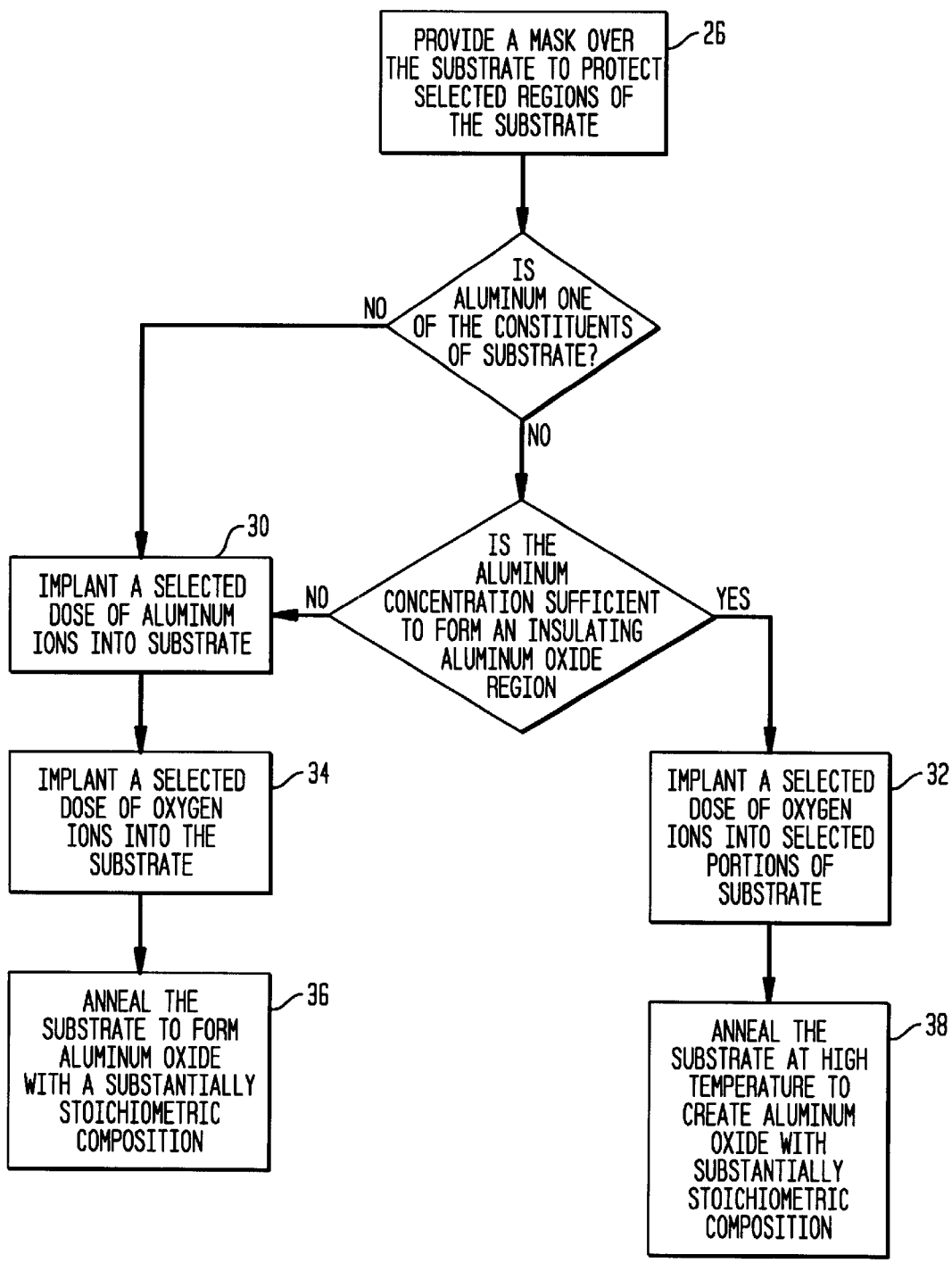
FIG. 2 is a flow chart depicting various steps according to one embodiment of the invention for producing a vertical insulating layer which contains aluminum oxide having a substantially stoichiometric composition.

With continued reference to FIG. 1 and a flow chart 24 of FIG. 2, in an exemplary embodiment of a method of the invention for producing the vertical insulating layers 20 and 22, in step 26, a mask 28 is placed over the substrate 18 so as to protect the regions of the substrate that will be utilized for forming the devices 12, 14, and 16 from subsequent processing steps. In particular, the mask 28 is opaque to the ions, e.g., oxygen and aluminum, to which the substrate is exposed in subsequent processing steps. Further, the exemplary mask 28 includes two openings 28a and 28b that permit the exposure of selected portions of the substrate 18, e.g., the portions separating the devices 12, 14, and 16 from one another, to ion beams 30, as described below.

As discussed above, the mask 28 is opaque to the ions bombarding the substrate 18. For example, a silicon oxide ($SiO_2$) or a silicon nitride ($Si_3N_4$) mask can be utilized when the substrate is exposed to a beam of oxygen or aluminum ions. Further, the mask 28 can be formed by utilizing a variety of techniques known in the art. For example, silicon oxide can be deposited on the substrate 18 by employing a chemical vapor deposition (CVD) process. The deposited silicon oxide can be subsequently lithographically or physically patterned. Further, various photolithographic techniques known in the art in combination with photoresists can be utilized to form the mask 28.

If the substrate 18 does not include aluminum as one constituent, e.g., the substrate 18 is GaAs, in step 30, the substrate 18 is exposed to a beam of aluminum ions so as to implant a selected dose of aluminum ions in the portions of the substrate that are not obstructed by the mask 28. Referring to FIG. 1, aluminum ions are implanted in the portion of the substrate separating the device 12 from device 14, and the portion separating device 14 from device 16.

A variety of ion implanters known in the art can be utilized to perform such an implantation step. For example, U.S. Pat. No. 4,693,760, herein incorporated by reference, describes one high current ion implanter that is suitable for the practice of the present invention. Further details regarding ion implantation practices and equipment can be obtained by refering to U.S. Pat. No. 5,436,499, herein incorporated by reference.

Figure 3:
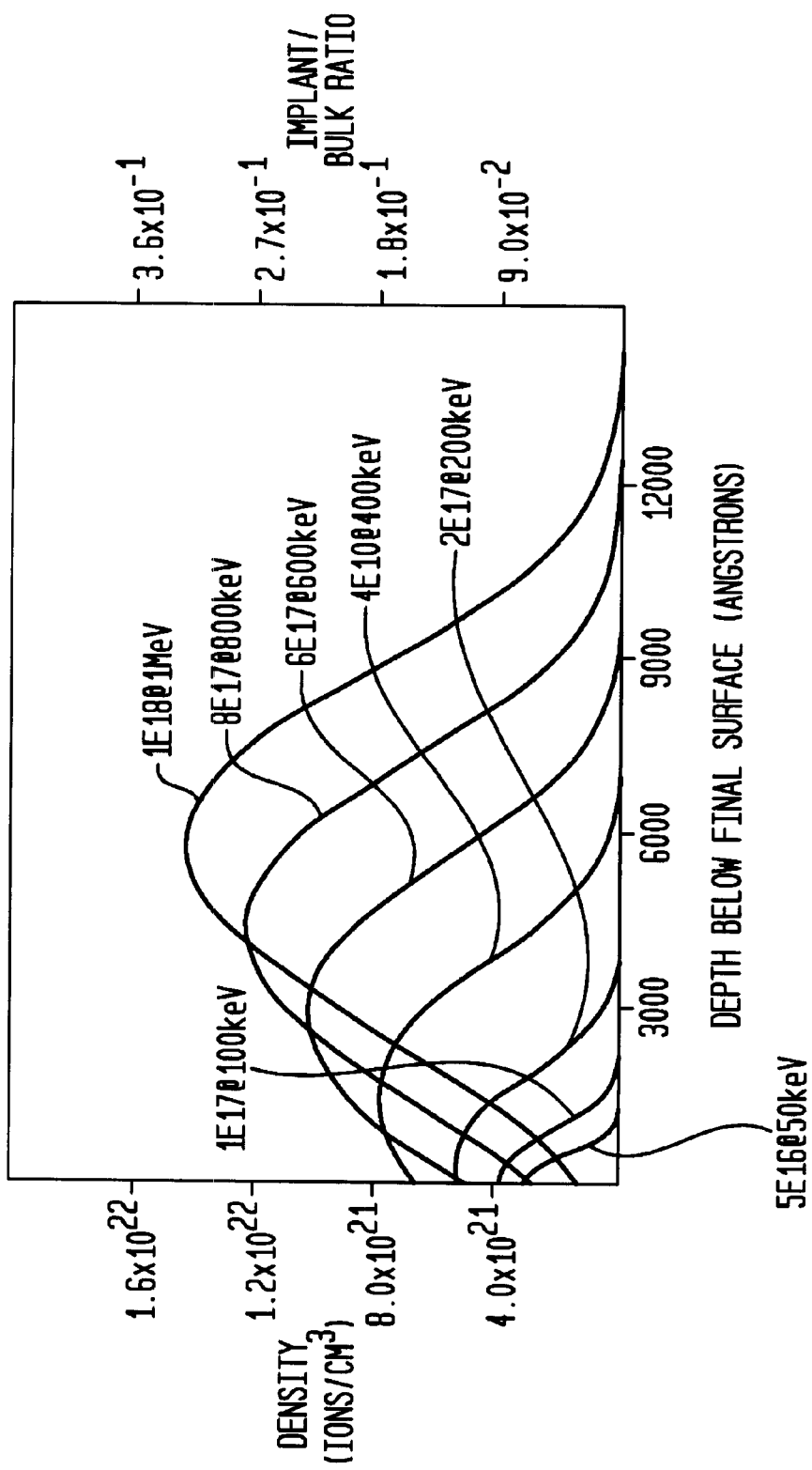
FIG. 3 illustrates a number of graphs depicting computer simulated distribution of aluminum ions implanted in a GaAs substrate by exposing the substrate to aluminum ion beams having different energies and densities.

In general, the distribution of implanted ions within a substrate exposed to an ion beam is a function of the ion energy and of the ion density (ions/$cm^2$). For example, FIG. 3 illustrates computer simulated graphs depicting the distribution of aluminum ions implanted in a GaAs substrate at various ion energies and densities. Each graph has a maximum at a particular depth below the substrate surface, and has a characteristic width indicating the degree of the spread of the implanted ions about the peak. As the ion energy increases, the peak of the distribution of the implanted ions shifts to a greater depth below the substrate surface. Hence, in one preferred embodiment for forming the vertical insulating layers 20/22, a number of ion implantation steps at different ion densities and energies are performed so as to ensure a substantially uniform distribution of the implanted ions within a selected region below the substrate surface.

For example, such a multi-step implantation process can be utilized to provide a substantially uniform distribution of aluminum ions over a selected vertical region below the substrate surface. The ion energy in each of these implantation steps can be in a range of about 0.5 keV to about 2000 keV, and the ion beam density can be in a range of $1\times10^{15}$ to about $10^{18}$ ions/$cm^2$. For example, two implantation steps, one at 50 keV with an ion density of about $5\times10^{16}$ ions/$cm^2$ and the other at 100 keV with an ion density of about $10^{17}$ ions/$cm^2$, can be utilized to provide a substantially uniform distribution of aluminum ions in a vertical portion extending from the substrate surface to a depth of approximately 0.5 micron.

Figure 4:
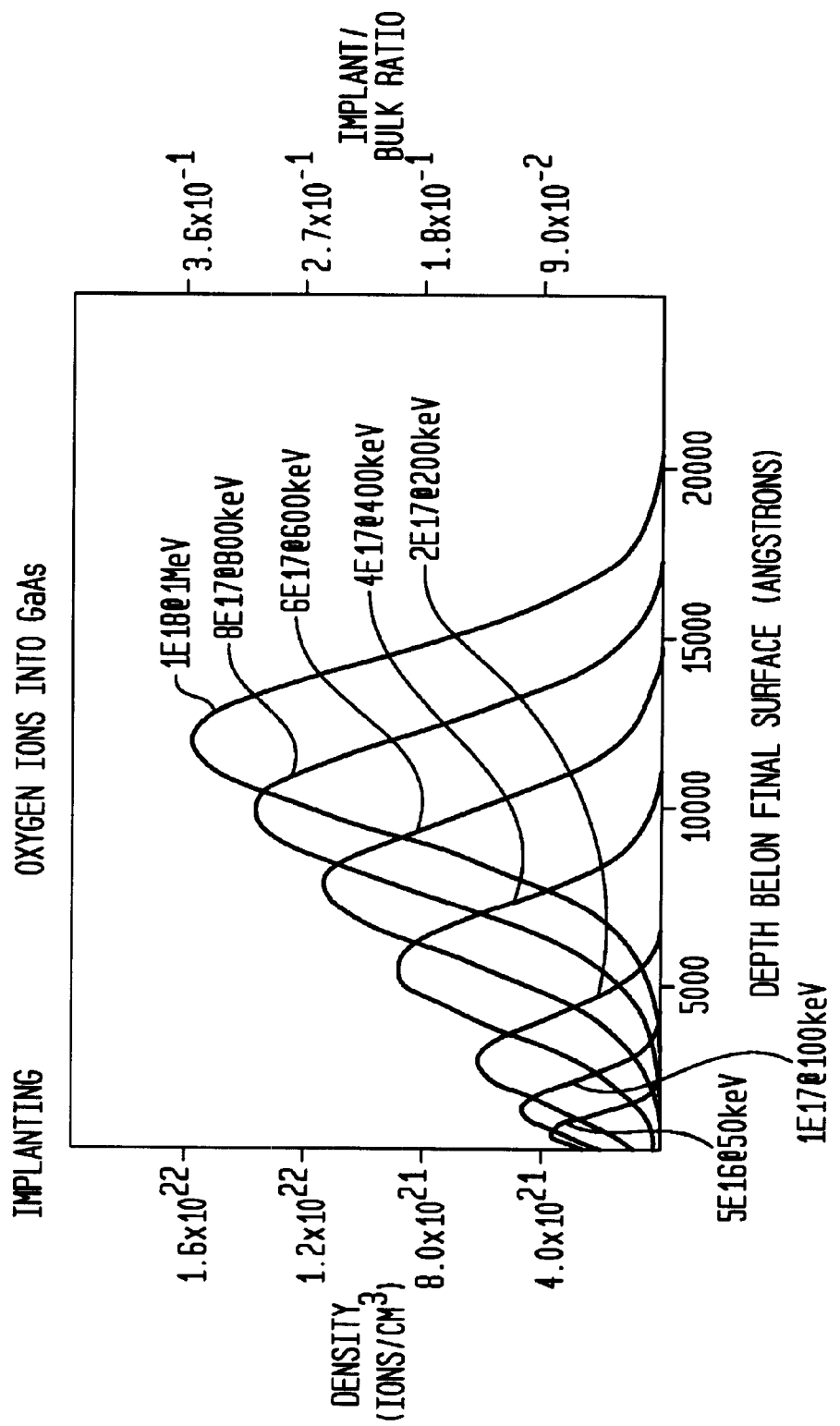
FIG. 4 illustrates a plurality of graphs, each of which depicts the distribution of oxygen ions in a GaAs substrate by directing a beam of oxygen ions having a selected energy and density to the substrate, FIG. 5A schematically illustrates a buried insulating layer having aluminum oxide with a substantially stoichiometric composition formed in a GaAs substrate in accord with the teachings of the invention, FIG. 5B schematically illustrates a buried insulating layer having aluminum oxide with a substantially stoichiometric composition formed in Ga$_{0.2}$Al$_{0.8}$As in accord with the teachings of the invention, FIG. 6 schematically illustrates a semiconducting waveguide structure formed according to the method of the invention, FIG. 7 schematically illustrates a method according to the invention for creating the semiconducting waveguide structure of FIG. 6, FIG. 8A schematically illustrates a heterostructure in which aluminum and oxygen ions are implanted in another method for creating the semiconducting waveguide structure of FIG. 6, FIG. 8B schematically illustrates forming the semiconducting waveguide structure of FIG. 6 by depositing a layer of AlGaAs on the heterostructure of FIG. 8 subsequent to implanting oxygen and aluminum ions in selected portions of the heterostructure, and FIG. 9 schematically illustrates a vertical cavity surface emitting laser having an insulating portion containing aluminum oxide with a substantially stoichiometric composition surrounding an internal aperture.

Subsequent to the aluminum implantation step, in step 34, the substrate 18 is exposed to a beam of oxygen ions to implant oxygen in the portions of the substrate which contain the implanted aluminum ions. FIG. 4 illustrates computer simulated graphs depicting the distribution of implanted oxygen ions in a GaAs substrate exposed to a beam of oxygen ions as a function of the ion energy and ion density. Similar to the graphs of FIG. 3, these graphs also indicate that the peak density of the implanted ions shifts to greater depths below the substrate surface as the energy of the ion beam increases. Similar to the aluminum implantation step, the oxygen implantation step can be performed at a number of different energies and densities to ensure a substantially uniform distribution of oxygen over the region in which the implanted aluminum ions are distributed.

The beam of oxygen ions can have an energy in a range of about 0.5 kV to about 2000 keV. Further, the dose of the implanted oxygen ions can range from approximately $1\times10^{14}$ ions/$cm^2$ to about $1\times10^{18}$ ions/$cm^2$. For example, three implantation steps, the first at 50 keV with an ion density of about $5\times10^{16}$, the second at 100 kV with an ion density of about $1\times10^{17}$ and the third at 200 kV with an ion density of about $2\times10^{17}$, can be employed to distribute oxygen ions in a vertical portion extending from the substrate surface to a depth of about 0.5 micron and having implanted aluminum ions therein. The total dose of the implanted oxygen ions is selected such that there exists substantially three oxygen ions for every two aluminum ions in this vertical portion of the substrate.

More specifically, the doses of the oxygen and aluminum ions are selected so as to produce aluminum oxide, through a subsequent annealing step as described below, with substantially stoichiometric composition. For example, the dose and energy of the oxygen ions are chosen so as to form a region in which two aluminum ions are associated with three oxygen ions.

In step 36, the substrate is annealed at a high temperature in a selected atmosphere for a selected time period to cause the implanted oxygen and aluminum ions to react and to form aluminum oxide having a substantially stoichiometric composition. The choice of the ambient atmosphere for annealing, the annealing temperature and the annealing time depend on a number of factors, such as the type of substrate, the desired thickness of the insulating layers, etc. For example, when the substrate is GaAs, the annealing step can be performed in an ambient containing arsine gas with a partial pressure that exceeds the equilibrium vapor pressure of As over GaAs substrate. In one embodiment, the annealing is preferably performed in an ambient comprising about 10 percent arsine gas in a temperature range of 600–900° C. for about 90 minutes. Rapid thermal annealing with short cycle times (e.g., less than about 1 minute) at higher temperatures (e.g., above 900° C.) can also be utilized.

If aluminum is one of the constituents of the substrate and is present in a concentration sufficient to form either a continuous insulating oxide layer or highly concentrated oxide precipitates when combined with oxygen atoms, e.g., the substrate is GaAlAs, one embodiment of the invention bypasses the step of implanting aluminum ions into the substrate, and rather employs the aluminum ions of the substrate for formation of aluminum oxide. In particular, such an embodiment, in step 34a, implants a dose of oxygen ions into a selected portion of the substrate. The oxygen implantation step can be performed at several energies and doses, for example, by exposing the substrate to beams of oxygen ions having selected energies and densities through the openings in a mask disposed on the substrate, to ensure a substantially uniform distribution of the implanted oxygen ions. In addition, the total dose of oxygen ions is selected such that there exists substantially three oxygen atoms for every two aluminum atoms in the portion of interest.

Subsequently, in step 36a, the substrate is annealed, for example, in a manner similar to the annealing process described above, to cause the formation of bonds between the implanted oxygen ions and the aluminum ions of the substrate.

It should be understood that the step of implanting aluminum ions can, in some embodiments, be bypassed if aluminum is one of the atomic constituents of the substrate. In other embodiments of the invention, it can be desirable to implant a selected dose of aluminum ions into the substrate even if aluminum is one of the atomic constituents of the substrate.

As mentioned above, the method of the invention can be utilized to form insulating layers having high electrical resistance between semiconductor devices formed on a substrate. In one embodiment, the devices are vertical cavity surface emitting lasers (VCSEL) having a monolithic two-dimensional array structure utilized, for example, in telecommunications systems. The VCSEL's can be formed, for example, on a GaAs substrate. A vertical insulating layer having aluminum oxide with a substantially stoichiometric composition according to the teachings of the invention can electrically isolate one VCSEL from its neighbors.

A vertical insulating layer produced according to the teachings of the invention has a high electrical resistance, e.g., greater than about 1000 ohm-cm, because it contains aluminum oxide with a substantially stoichiometric composition. This high electrical resistance results in enhanced vertical isolation of two neighboring devices separated by the insulating layer. The enhanced isolation in turn provides distinct advantages. For example, it allows for faster switching of the devices. For example, if the devices form a two-dimensional monolithic array of VCSEL's, the faster switching time can be advantageous in telecommunications applications, such as time division multiplexing.

Figure 5A:
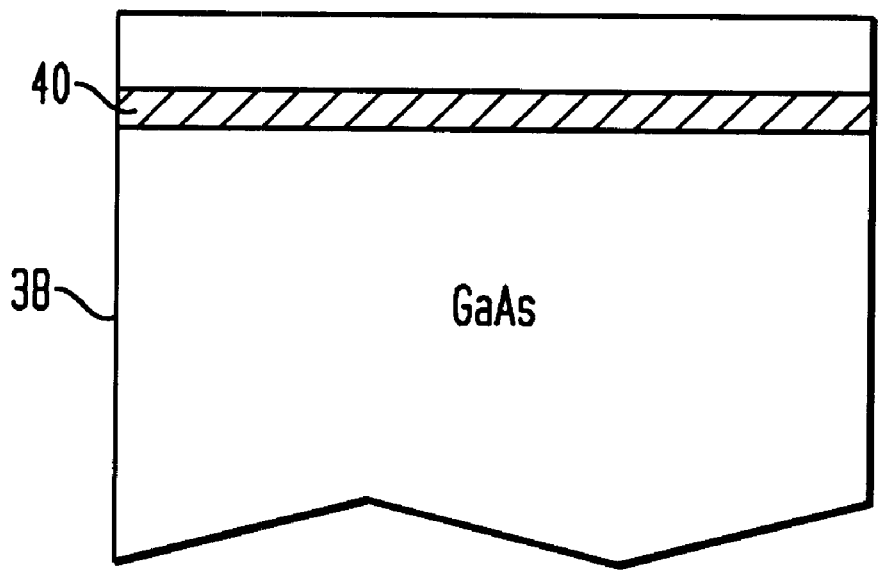

In another aspect, the present invention provides a buried insulating layer at a selected depth below a substrate surface. The buried insulating layer includes aluminum oxide with a substantially stoichiometric composition. For example, FIG. 5A illustrates a GaAs substrate 38 in which an aluminum oxide layer 40 having a substantially stoichiometric composition is formed in accord with the teachings of the invention. In particular, the GaAs substrate 38 is initially exposed to a beam of aluminum ions having an energy of about 600 keV for a time period sufficient to cause a substantially uniform implantation of a dose of approximately $6 \times 10^{17}/cm^2$ of aluminum ions over a selected portion of the substrate at a depth of about 0.5 microns. Subsequently, the GaAs substrate 38 is exposed to a beam of oxygen ions having an an energy of about 180 keV for a time period sufficient to distribute a total dose of approximately $9 \times 10^{17}/cm^2$ of oxygen ions substantially uniformly over the region in which the aluminum ions were implanted.

The GaAs substrate 38 is then annealed, preferably in an atmosphere containing arsine, at a temperature of about 800° C. for a period of approximately 2 hours to form the aluminum oxide layer 40. In some cases, the gallium and arsenic atoms diffuse out of the layer 40 such that the layer 40 is a continuous aluminum oxide film having a stoichiometric composition. In other cases, the layer 40 includes a mixture of stoichiometric precipitates aluminum oxide and GaAs.

Figure 5B:
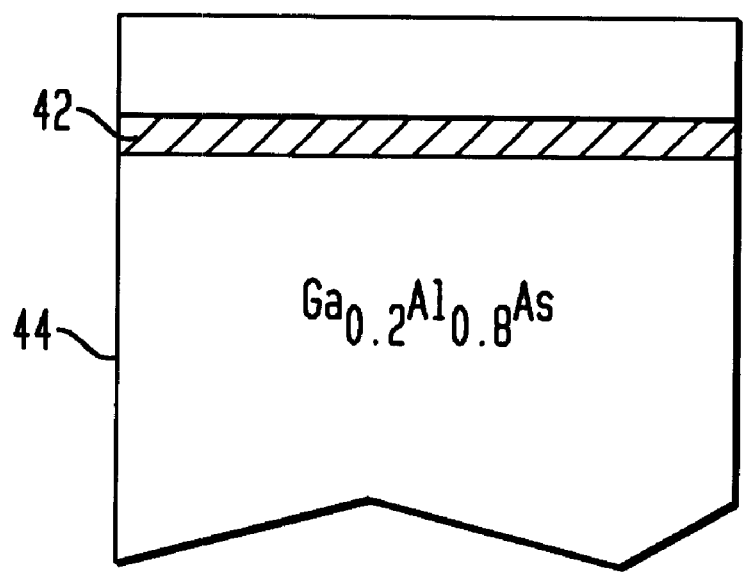

FIG. 5B illustrates another insulating layer 42 formed at a depth of approximately 0.5 micron in an $Ga_{0.2}Al_{0.8}As$ substrate 44 by implanting oxygen ions through exposure of the substrate 44 to an oxygen beam having an energy of about 180 keV for a time period sufficiently long to effectuate implantation of a total dose of approximately $9 \times 10^{17}$ ions/cm$^2$. A subsequent annealing step, similar to the annealing steps described above, can result in the formation of the layer 42 having aluminum oxide with a substantially stoichiometric composition.

Figure 6:
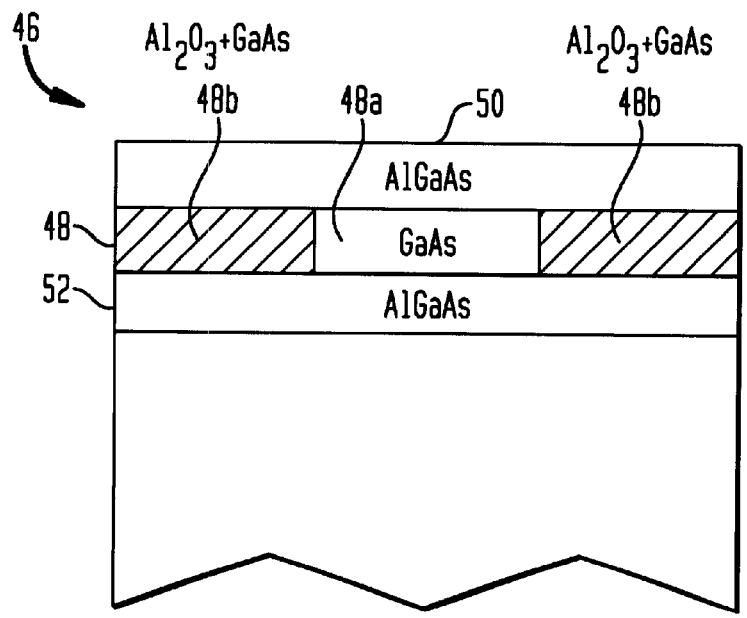

Semiconductor structures according to the invention which include aluminum oxide with a substantially stoichiometric composition are not limited to those described above. For example, FIG. 6 illustrates a semiconductor structure 46 having a waveguide layer 48. The exemplary waveguide layer 48 is formed between two AlGaAs layers 50 and 52, and includes a central portion 48a formed of GaAs and a peripheral portion 48b, formed in accord with the teachings of the invention, as described in more detail below.

The peripheral portion 48b contains aluminum oxide with a substantially stoichiometric composition, and hence has an index of refraction that is different, e.g., lower, from that of the central portion 48a. This difference in the index of refraction causes light traveling through the waveguide center, i.e., the portion 48a, to remain confined to the portion 48a by total internal reflections at points along the interface between the portions 48a and the portion 48b.

Figure 7:
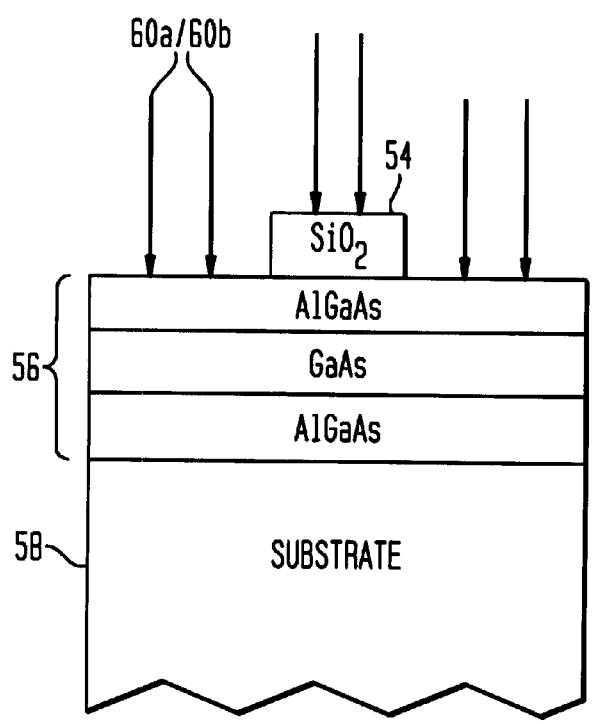

FIG. 7 illustrates an exemplary method according to the invention for forming the waveguide structure 46. A mask 54 formed, for example, of silicon oxide, e.g., $SiO_2$, and patterned to protect the central portion of a heterostructure 56 from subsequent processing steps is deposited over a portion of the top surface of the heterostructure. The heterostructure 56 is formed, for example, over a substrate 58 and has a GaAs layer interposed between two AlGaAs layers.

Subsequently, the top surface of the hetero-structure 56 is exposed to a beam of oxygen ions 60a, followed by exposure to a beam of aluminum ions 60b, or vice versa. The energies of the oxygen and aluminum ions are selected so as to cause their implantation in portions of the Ga As layer not obstructed by the mask 54. For example, if the thickness of the top AlGaAs layer is about 0.3 microns, oxygen ions having an energy of about 400 keV are substantially implanted below this upper layer, that is, in the GaAs layer. Moreover, aluminum ions having energies above approximately 600 keV can penetrate the upper AlGaAs layer. Further, the doses of the implanted oxygen and aluminum ions are selected such that there are substantially three oxygen atoms for every two aluminum atoms in the implanted region. An annealing step which can include heating the hetero-structure at a temperature of about 900 C. for a period of about 90 minutes in an arsine atmosphere results in formation of aluminum oxide with a substantially stoichiometric composition in the implanted regions. The mask 54 is typically removed prior to the annealing step, for example, through etching with hydrofluoric acid.

In some embodiments, the Ga and As atoms migrate out of the insulating regions such that the peripheral insulating layer 48b is a continuous layer of stoichiometric aluminum oxide. In other embodiments, the insulating layer 48b contains a plurality of stoichiometric aluminum oxide precipitates.

Figure 8A:
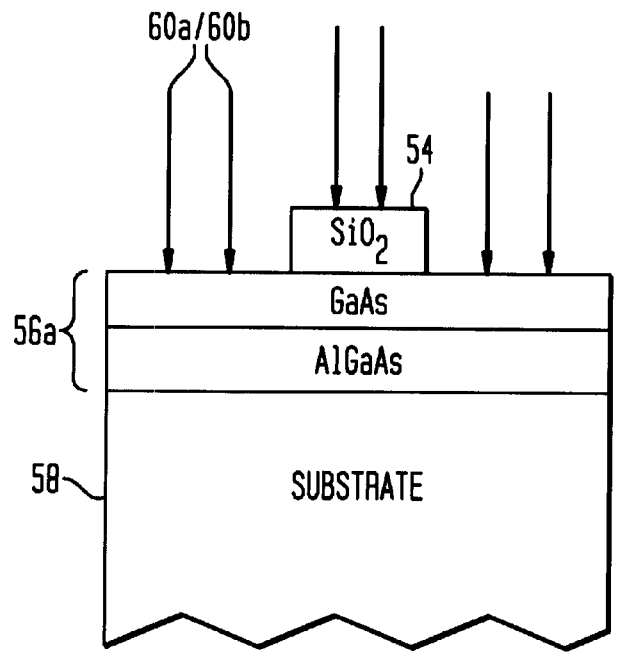
Figure 8B:
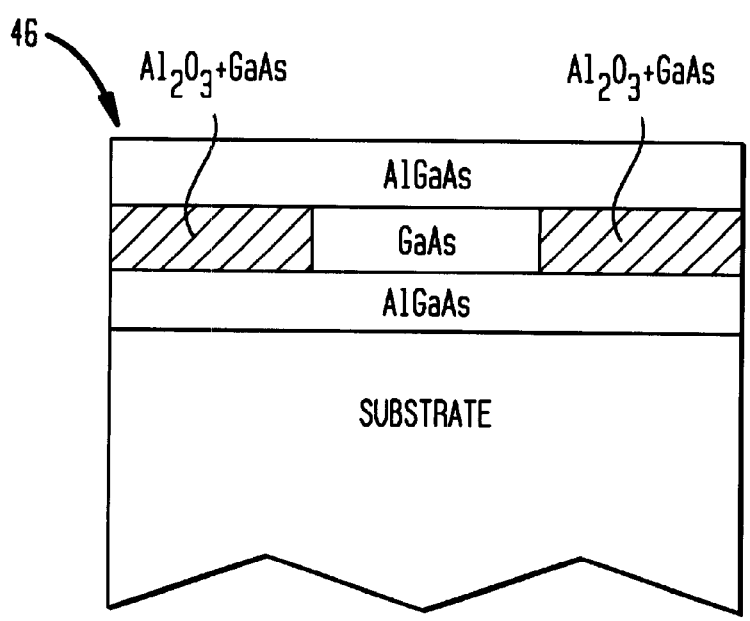

With reference to FIGS. 8A and 8B, in another method according to the invention for producing the semiconductor structure 46 (FIG. 6), in an initial step, a mask 54, for example, SiO$_2$, is deposited over a portion of a top surface of a heterostructure 56a which includes a GaAs layer and an AlGaAs layer formed on a substrate 58. Subsequently, aluminum and oxygen ions with energies in ranges of approximately 50 to 300 keV and 35 to 200 keV, respectively, are deposited in a peripheral portion of the GaAs layer which is not protected by the mask 54. The deposition of the ions in the peripheral portion can be achieved, for example, by exposing the masked heterostructure to beams of oxygen and aluminum ions 60a/60b. The doses of the implanted oxygen and aluminum ions are selected such that there are substantially three oxygen atoms for every two aluminum atoms in the implanted regions. An anneal step, performed either after removal of the mask or with the mask present, in a manner similar to that described above will result in formation of aluminum oxide having a substantially stoichiometric composition in the peripheral portions of the GaAs layer. Subsequently, the mask 54 is removed, and a layer of AlGaAs is formed, for example, epitaxially, over the heterostructure to produce the waveguide structure 46, as shown in FIG. 8B.

The method of the invention can be employed to create an insulating layer surrrounding an internal aperture in a VCSEL, where the insulating layer contains aluminum oxide with a substantially stoichiometric composition. VCSEL's are known in the art. Molecular beam epitaxial techniques are typically employed to create VCSEL heterostructures. For example, U.S. Pat. No. 5,328,854, herein incorporated by reference, describes methods for producing VCSEL's.

Figure 9:
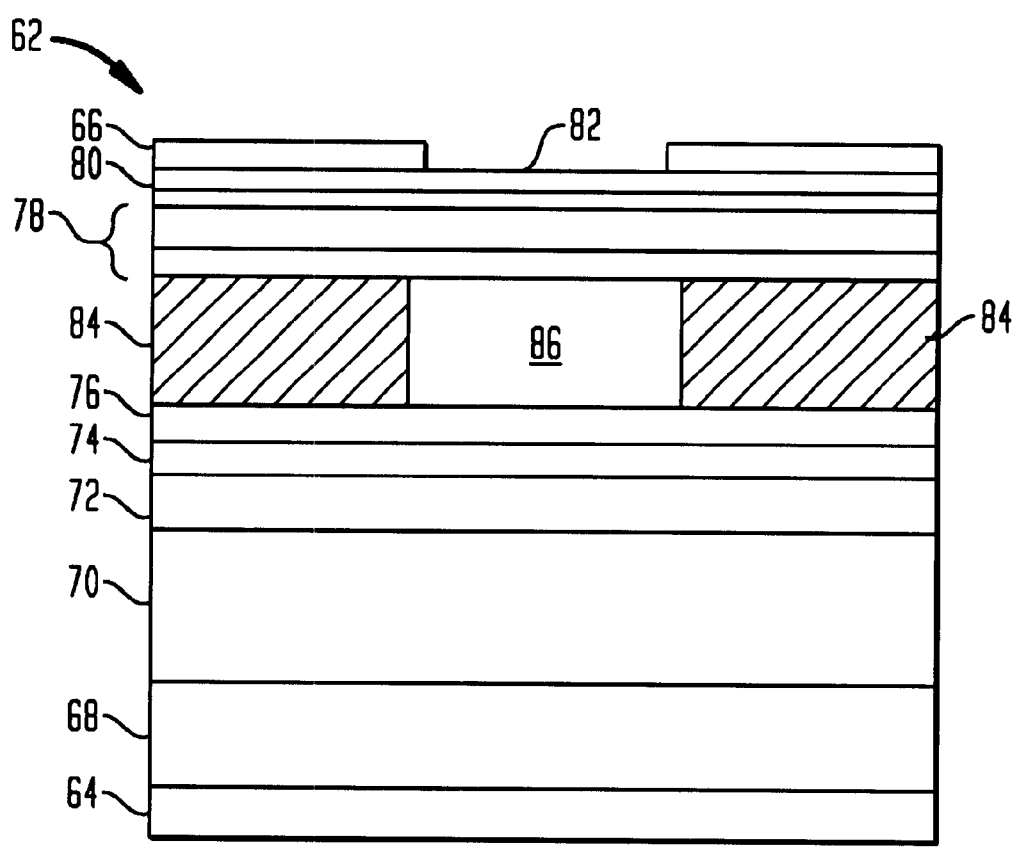

FIG. 9 illustrates an exemplary structure 62 of a VCSEL device having a bottom electrode 64 and a top electrode 66. The device 62 can further include a substrate 68, a distributed Bragg reflector (DBR) 70, a bottom confining layer 72, an active region 74, a top confining layer 76, a DBR top mirror 78, and a high conductivity contact layer 80, positioned between the top DBR mirror and the top electrode allowing formation of non-alloyed, ohmic contact to the top electrode.

The device 62 includes an aperture 82 that permits transmission of lasing radiation from the active region 74 to the outside environment. An insulating layer 84, formed in accord with the teachings of the invention, surrounds an internal aperture 86 and restricts the passage of current from the top electrode to the bottom electrode to the central portion of the active layer defined by the aperture 86. The active region 74 can contain GaAs quantum wells.

The peripheral insulating layer 78 can contain GaAs and aluminum oxide having a stoichiometric composition according to the teachings of the invention. The insulating layer 84 can be formed, for example, by implanting a selected dose of oxygen ions in the peripheral portion of an AlGaAs layer. Subsequently, an annealing step at high temperature can cause reaction of the implanted oxygen with the aluminum atoms to form aluminum oxide. The dose of oxygen ions is selected in accord with the teachings of the invention such that the aluminum oxide has a substantially stoichiometric composition. This advantageously provides an insulating layer surrounding the aperture 86 which has a high electrical resistance. The high electrical resistance in turn allows more efficient channeling of current between the top and bottom electrodes through the active region 74 of the VCSEL.

Another structure in which aluminum oxide layers, formed according to the teachings of the invention to have substantially stiochiometric composition, can be utilized include a photonic band gap laser, such as the laser described in an article entitled "Room-temperature triangular-lattice two-dimensional photonic band gap lasers operating at 1.54 $\mu$m", published in Applied Physics Letters, volume 76, number 21, pages 2982–2984 (May 22, 2000), herein incorporated by reference.

The above embodiments are intended as illustrative and not limiting of the scope of the invention. Those skilled in the art can make numerous variations and modifications to the above embodiments without departing from the scope of the invention. For example, different ions energies and different masks can be utilized to create insulating layers having aluminum oxide with substantially stoichiometric composition in accord with the teachings of the invention.

What is claimed is:

1. A method of producing an electrically insulating layer in a semiconductor substrate, the method comprising the steps of:
    implanting a selected dose of aluminum ions in a selected portion of said substrate,
    implanting a selected dose of oxygen ions in said portion, and
    annealing said substrate to cause formation of an insulating layer having aluminum oxide in said portion,
    wherein said doses of said oxygen and aluminum ions are selected such that aluminum-oxygen ratio in said insulating layer is substantially stoichiometric.

2. The method of claim 1, wherein said annealing step is performed at a temperature in a range of about 600° C. to about 1000° C.

3. The method of claim 1, wherein said step of implanting aluminum ions further includes exposing said substrate to a beam of aluminum ions having a selected energy.

4. The method of claim 3, further comprising the step of selecting the energy of the beam of aluminum ions to be a range of about 0.5 keV to about 2000 keV.

5. The method of claim 1, further comprising the step of placing a mask over said semiconductor substrate so as to expose said selected portion of the substrate to said beam of ions.

6. The method of claim 5, further comprising the step of selecting said mask to be formed of any of silicon oxide, silicon nitride and silica.

7. The method of claim 1, wherein said step of implanting oxygen ions further includes exposing said substrate to a beam of oxygen ions.

8. The method of claim 7, further comprising the step of selecting energy of said beam of oxygen ions to be in a range of about 0.5 keV to about 2000 keV.

9. A method of producing a buried insulating layer in a semiconductor substrate having aluminum as one constituent, comprising the steps of:
    implanting a selected dose of oxygen ions at in a region at a selected depth of the substrate,
    annealing the substrate to form a layer containing aluminum oxide at said depth,
    wherein said dose of oxygen ions is selected such that the aluminum oxide has a substantially stoichiometric composition.

10. A method of producing an electrically insulating layer in a semiconductor substrate, the method comprising the steps of:
    implanting a selected dose of aluminum ions in a selected vertical portion of said substrate,
    implanting a selected dose of oxygen ions in said portion, and annealing said substrate to cause formation of an insulating layer having aluminum oxide in said portion, wherein said doses of said oxygen and aluminum ions are selected such that aluminum-oxygen ratio in said insulating layer is substantially stoichiometric, and wherein the step of implanting aluminum ions comprises exposing the substrate to a plurality of aluminum ion beams having selected ion densities and different energies, and wherein the step of implanting a selected dose of oxygen ions further comprises exposing the substrate to a plurality of oxygen ion beams having selected ion densities and energies such that the implanted oxygen ions are distributed substantially uniformly over the region in which the aluminum ions are implanted with a substantially stoichiometric ratio of aluminum and oxygen ions.

11. The method of claim 10, wherein the energies of the aluminum beams are in a range of about 0.5 to about 2000 keV.

12. The method of claim 10, further comprising selecting the energies of oxygen beams to be in a range of about 0.5 keV to about 2000 keV.

* * * * *